(12) United States Patent
Yu et al.

(10) Patent No.: US 9,903,043 B2
(45) Date of Patent: Feb. 27, 2018

(54) CRUCIBLE ASSEMBLY AND METHOD OF MANUFACTURING CRYSTALLINE SILICON INGOT BY USE OF SUCH CRUCIBLE ASSEMBLY

(71) Applicant: Sino-American Silicon Products Inc., Hsinchu (TW)

(72) Inventors: Wen-Huai Yu, Hsinchu (TW); Hung-Sheng Chou, Hsinchu (TW); Yu-Min Yang, Hsinchu (TW); Kuo-Wei Chuang, Hsinchu (TW); Sung-Lin Hsu, Hsinchu (TW); I-Ching Li, Hsinchu (TW); Wen-Ching Hsu, Hsinchu (TW)

(73) Assignee: SINO-AMERICAN SULICON PRODUCTS INC., Hsinchu (TW)

( * ) Notice: Subject to any disclaimer, the term of this patent is extended or adjusted under 35 U.S.C. 154(b) by 271 days.

(21) Appl. No.: 14/598,779

(22) Filed: Jan. 16, 2015

(65) Prior Publication Data
US 2015/0197873 A1    Jul. 16, 2015

(30) Foreign Application Priority Data
Jan. 16, 2014   (TW) .............. 103101540 A

(51) Int. Cl.
C30B 11/00    (2006.01)
C30B 29/06    (2006.01)

(52) U.S. Cl.
CPC ............ *C30B 11/002* (2013.01); *C30B 29/06* (2013.01); *Y10T 117/1092* (2015.01)

(58) Field of Classification Search
CPC combination set(s) only.
See application file for complete search history.

(56) References Cited

U.S. PATENT DOCUMENTS

| | | | | |
|---|---|---|---|---|
| 4,356,152 A | * | 10/1982 | Berkman | ............ C30B 15/10 117/211 |
| 5,416,795 A | * | 5/1995 | Kaniuk | ............ H05B 6/24 264/618 |
| 2008/0220154 A1 | * | 9/2008 | Gallagher | ......... H01M 8/0213 427/115 |

FOREIGN PATENT DOCUMENTS

CN    102776554 A    11/2012

* cited by examiner

*Primary Examiner* — Duy Vu N Deo
*Assistant Examiner* — Erin F Bergner
(74) *Attorney, Agent, or Firm* — Muncy, Geissler, Olds & Lowe, P.C.

(57) ABSTRACT

The invention provides a crucible assembly and method of manufacturing a crystalline silicon ingot by use of such crucible assembly. The crucible assembly of the invention includes a crucible body and a fiber textile article. The fiber textile article is made of a plurality of carbon fibers, and is loaded on a bottom of the crucible body. The fiber textile article has a plurality of intrinsic pores randomly arranged.

11 Claims, 18 Drawing Sheets

CRUCIBLE ASSEMBLY AND METHOD OF MANUFACTURING CRYSTALLINE SILICON INGOT BY USE OF SUCH CRUCIBLE ASSEMBLY

CROSS-REFERENCE TO RELATED APPLICATION

This utility application claims priority to Taiwan Application Serial Number 103101540, filed Jan. 16, 2014, which is incorporated herein by reference.

BACKGROUND OF THE INVENTION

1. Field of the Invention

The invention relates to a crucible assembly and a method of manufacturing a crystalline silicon ingot casting by use of such crucible assembly, and particularly to a crucible assembly capable of lowering impurities and oxygen content and reducing red zone of a crystalline silicon ingot fabricated by such crucible assembly. Moreover, the photoelectric conversion efficiency of photovoltaic cell made from the crystalline silicon ingot fabricated by the crucible assembly is improved significantly.

2. Description of the Prior Art

Most of the photovoltaic cells produce a photovoltaic effect when absorbing sunlight. Currently, the photovoltaic cell is made of a silicon-based material, since for the most parts; silicon is the second most abundant and accessible element on Earth. Also, silicon is cost-effective, nontoxic, and chemically stable, and becomes broadly used in semiconductor applications.

There are three forms of crystalline silicon for fabricating silicon-based photovoltaic cells, i.e., mono-crystal silicon (mono-Si), multi-crystal or poly-crystal silicon (poly-Si), and amorphous silicon (a-Si). Multi-crystal or poly-crystal silicon is much less expensive than mono-crystalline silicon when produced by Czochralski (CZ) method or float zone (FZ) method, so it is usually used as a raw material of the photovoltaic cell due to the economic concern.

Conventionally, multi-crystal or poly-crystal silicon for photovoltaic cells is fabricated by a common casting process. That is, it is prior art to produce multi-crystal or poly-crystal silicon for photovoltaic cells by a casting process. In brief, the multi-crystal or poly-crystal silicon photovoltaic cell is fabricated by melting high purity silicon in a mold such as a quartz crucible, then cooling the melted silicon in a controlled solidification to form a multi-crystal or poly-crystal silicon ingot. The multi-crystal or poly-crystal silicon ingot is generally cut into bricks having a cross-section that is the same as or close to the size of the wafer to be used for manufacturing a photovoltaic cell, and the bricks are sawed or otherwise cut into such wafers. The ploy-Si produced in such manner is an agglomeration of crystal grains where, within the wafers made therefrom, the orientation of the silicon grains relative to one another is practically random.

The random orientation of silicon grains, in either conventional multi-crystal or poly-crystal silicon, makes it difficult to texture the surface of a resulting wafer. Texturing is used to improve efficiency of a photovoltaic cell, by reducing light reflection and improving light energy absorption through the surface a cell. Additionally, "kinks" that form in the boundaries between the grains of conventional multi-crystal or poly-crystal silicon tend to nucleate structural defects in the form of clusters or lines of dislocations. These dislocations, and the impurities they tend to attract, are believed to cause a fast recombination of electrical charge carriers in a functioning photovoltaic cell made from conventional multi-crystal or poly-crystal silicon. This can cause a decrease in the efficiency of the cell. Photovoltaic cells made from such multi-crystal or poly-crystal silicon generally have lower efficiency compared to equivalent photovoltaic cells made from mono-crystal silicon, even considering the radial distribution of defects present in monocrystalline silicon produced by known techniques. However, because of the relative simplicity and lower costs for manufacturing conventional multi-crystal or poly-crystal silicon, as well as effective defect passivation in cell processing, multi-crystal or poly-crystal silicon is a more widely used form of silicon for manufacturing photovoltaic cells.

Currently, it has been developed that crystalline silicon ingot is fabricated using a mono-crystal silicon seed layer and based on a directional solidification. In this way, a high quality ingot of mono-crystalline silicon and/or bi-crystal silicon block or mono-like crystal silicon block may be obtained, in which the lifetime of the minority carriers is maximized in the resultant wafer employed for fabricating a high-performance photovoltaic cell. As used herein, the term "mono-crystal silicon" refers to a body of single crystal silicon, having one consistent crystal orientation throughout. The term "bi-crystal silicon" refers to a body of silicon, having one consistent crystal orientation throughout for greater than or equal to 50% by volume of the body, and another consistent crystal orientation for the remainder of the volume of the body. For example, such bi-crystal silicon may include a body of single crystal silicon having one crystal orientation next to another body of single crystal silicon having a different crystal orientation making up the balance of the volume of crystalline silicon. The term "mono-like crystal silicon" refers to a body of silicon, having one consistent crystal orientation throughout for greater than 75% by volume of the body. Additionally, conventional multi-crystal silicon refers to crystalline silicon having cm-scale grain size distribution, with multiple randomly oriented crystals located within a body of silicon. The term "poly-crystal silicon" refers to crystalline silicon with micron order grain size and multiple grain orientations located within a given body of silicon. For example, the grains are typically an average of about submicron to sub-millimeter in size (e.g., individual grains may not be visible to the naked eye), and grain orientation distributed randomly throughout.

It has also been developed that crystalline silicon ingot is fabricated using a nucleation promotion layer constituted by granulars of mono-crystal or poly-crystal silicon to assist in nucleation of silicon grains and based on a directional solidification. The resultant crystalline silicon ingot has small-sized silicon grains at the bottom thereof and low density of bulk defects, and can be used for fabricating a high-performance photovoltaic cell. By the nucleation promotion layer of small-sized crystal particles, the fineness of silicon grains can inhibit the growth of dislocations to reduce the opportunity of dislocation growth. The photoelectric conversion efficiency of photovoltaic cell made from such crystalline silicon ingot is quite high.

The region in crystalline silicon ingot, which is generally fabricated using crucible and does not meet requirement, represents as "red zone". The photovoltaic cell made from the red zone of general crystalline silicon ingot has low minority carrier lifetime. The causes of red zone include: a. the region containing impurities in solid state diffusion from crucible; b. the region of non-perfect crystal structure near the crucible; c. the boron-rich or oxygen-rich region; and d. the crystalline seeds and nucleation layer containing metal in liquid state diffusion from the silicon melt containing metal. In general, the region containing impurities, especially metal impurities, in solid state diffusion from crucible is the primary cause of red zone. The photoelectric conversion efficiency of photovoltaic cell made from the red zone of crystalline silicon ingot severely decays and decreases.

The red zone of current crystalline silicon ingots, fabricated using a layer of single crystal seeds or a nucleation promotion layer of mono-crystal or poly-crystal silicon granulars disposed at the bottom of crucible, is larger than or even twice as much as that of crystalline silicon ingots fabricated using no above layers. Studying its causes, during fabrication of the crystalline silicon ingot, impurities primarily consisting of metal impurities (e.g., Fe, Al, etc.) in the crucible are dissolved in the silicon melt, and then diffuse into single crystal seeds or mono-crystal or poly-crystal silicon granulars. As silicon grains from the silicon melt nucleate and grow at the single crystal seeds or the mono-crystal or poly-crystal silicon granulars, the impurities in the polluted single crystal seeds or the polluted mono-crystal or poly-crystal silicon granulars will diffuse back into solidified silicon crystals.

Chinese publication no. CN102776554A, filed by LDK SOLAR Corp., discloses a method of fabricating a polycrystalline silicon ingot. The method of CN102776554A includes the step of coating a layer of silicon nitride on the inner wall of a crucible where another function the layer of silicon nitride is used as the releasing agent preventing the polycrystalline silicon ingot from sticking the crucible during cooling and resulting in releasing failure. A layer of porous material is disposed on the bottom of the crucible, and then, a silicon feedstock is filled on the layer of porous material. Afterward, the method of CN102776554A is to heat the crucible to melt the silicon feedstock into a silicon melt, and then, to solidify the silicon melt into the polycrystalline silicon ingot on the basis of a directional solidification. During fabrication of the polycrystalline silicon ingot, the layer of silicon nitride coated on the inner wall of crucible can prevent impurities in the crucible from diffusing into the silicon melt and the polycrystalline silicon ingot to enhance the quality of the polycrystalline silicon ingot. The layer of porous material is a porous plate which is formed by sintering of silicon nitride, silicon carbide or quartz. The pores of the porous plate are extrinsic, formed by molding and regularly arranged. The pores of the porous plate can assist silicon grains in nucleation during fabrication of the polycrystalline silicon ingot. In the published specification of CN102776554A, it is issued that the method achieves well initial nucleation of silicon grains to effectively control the growth of dendrites, to lower multiplication of dislocations during growth of the polycrystalline silicon ingot, and to obtain the polycrystalline silicon ingot with good quality.

However, the layer of porous material disclosed in CN102776554A is a layer of rigid and porous material. The crystalline silicon ingot after nucleation and growth has plasticity at a high temperature (about 800° C.), and so has stress caused by the silicon melt pressing on the top of the crystalline silicon ingot. Because the layer of rigid and porous material cannot relieve the stress in the crystalline silicon ingot, there is still much room for improvement in inhibiting increasing of defects such as dislocations for manufacture of a crystalline silicon ingot by use of a layer of porous material.

In addition, the layer of porous material disclosed in CN102776554A provides regularly arranged pores which nucleate silicon grains unlike the silicon grains nucleated by randomly arranged pores. The silicon grains nucleated by the randomly arranged pores can use stress field to attract defects to agglomerate or use slip on the grain boundaries to release thermal stress to inhibit rapid increasing of defects such as dislocations. In addition, in the specification of CN102776554A, the layer of silicon nitride on the inner wall of the crucible can prevent impurities in the crucible from diffusing into the silicon melt and the polycrystalline silicon ingot, but it still has much room for improvement in lowering defect density in the polycrystalline silicon ingot. Moreover, the method of CN102776554A cannot effectively assist the crystalline silicon ingot in reducing oxygen content.

In view of the foregoing problems of prior arts, there is no crucible capable of lowering cost, assisting in releasing therefrom, and effectively assisting in manufacturing a crystalline silicon ingot which reduces impurities, defects such as dislocations and oxygen content therein and reduces red zone thereof. The photoelectric conversion efficiency of photovoltaic cell made from such crystalline silicon ingot will enhance significantly.

SUMMARY OF THE INVENTION

Accordingly, one scope of the invention is to provide a crucible assembly and a method of manufacturing a crystalline silicon ingot casting by use of such crucible assembly. In particular, the crucible assembly of the invention can be used to a crystalline silicon ingot whose impurities, oxygen content and red zone are reduced. Moreover, the crucible assembly of the invention can assist the crystalline silicon ingot in releasing therefrom. The photoelectric conversion efficiency of photovoltaic cell made from the crystalline silicon ingot fabricated, according to the method of the invention, is improved significantly.

A crucible according to preferred embodiment of the invention includes a crucible body and a first fiber textile article. The crucible body has a bottom. The first fiber textile article is made of a plurality of first carbon fibers, and loaded on the bottom of the crucible body. In particular, the first fiber textile article has a plurality of intrinsic first pores randomly arranged.

Further, the crucible body of the invention also has an inner sidewall. The crucible assemble of the invention further includes a second fiber textile article which is made of a plurality of second carbon fibers and loaded on the inner sidewall of the crucible body. In particular, second fiber textile article has a plurality of intrinsic second pores randomly arranged.

A method according to a first preferred embodiment of the invention is, firstly, to prepare the crucible assembly of the invention. Next, the method of the invention is to load a silicon feedstock on the first fiber textile article in the crucible assembly. Then, the method of the invention is to heat the crucible assembly until the silicon feedstock is melted into a silicon melt completely. Afterward, the method of the invention is, based on a directional solidification process, to cool the crucible assembly such that a plurality of silicon grains from the silicon melt nucleate at the intrinsic first pores and grow in a vertical direction of the crucible assembly. Finally, the method of the invention is, based on the directional solidification process, to continuously cool the crucible assembly until entirety of the silicon melt is solidified to obtain the crystalline silicon ingot.

A method according to a second preferred embodiment of the invention is, firstly, to prepare the crucible assembly of the invention. Next, the method of the invention is to load a plurality of crystalline particles with irregular shape on the first fiber textile article in the crucible assembly. Then, the method of the invention is to load a silicon feedstock on the plurality of crystalline particles with irregular shape in the crucible assembly. Afterward, the method of the invention is to heat the crucible assembly until the silicon feedstock is melted into a silicon melt completely where the crystalline particles with irregular shape are melt partly. Then, the method of the invention is, based on a directional solidification process, to cool the crucible assembly such that a plurality of silicon grains from the silicon melt nucleate at the crystalline particles with irregular shape and grow in a vertical direction of the crucible assembly. Finally, the method of the invention is, based on the directional solidification process, to continuously cool the crucible assembly until entirety of the silicon melt is solidified to obtain the crystalline silicon ingot where the first fiber textile article assist the crystalline silicon ingot in releasing from the crucible body.

Distinguishable from the prior art, the crystalline silicon ingot, fabricated by use the crucible assembly of the invention, lowers cost, has small sized silicon grains at the bottom thereof and reduces defect density and impurity-polluted zone. Moreover, the crucible assembly of the invention can assist the crystalline silicon ingot in releasing therefrom.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
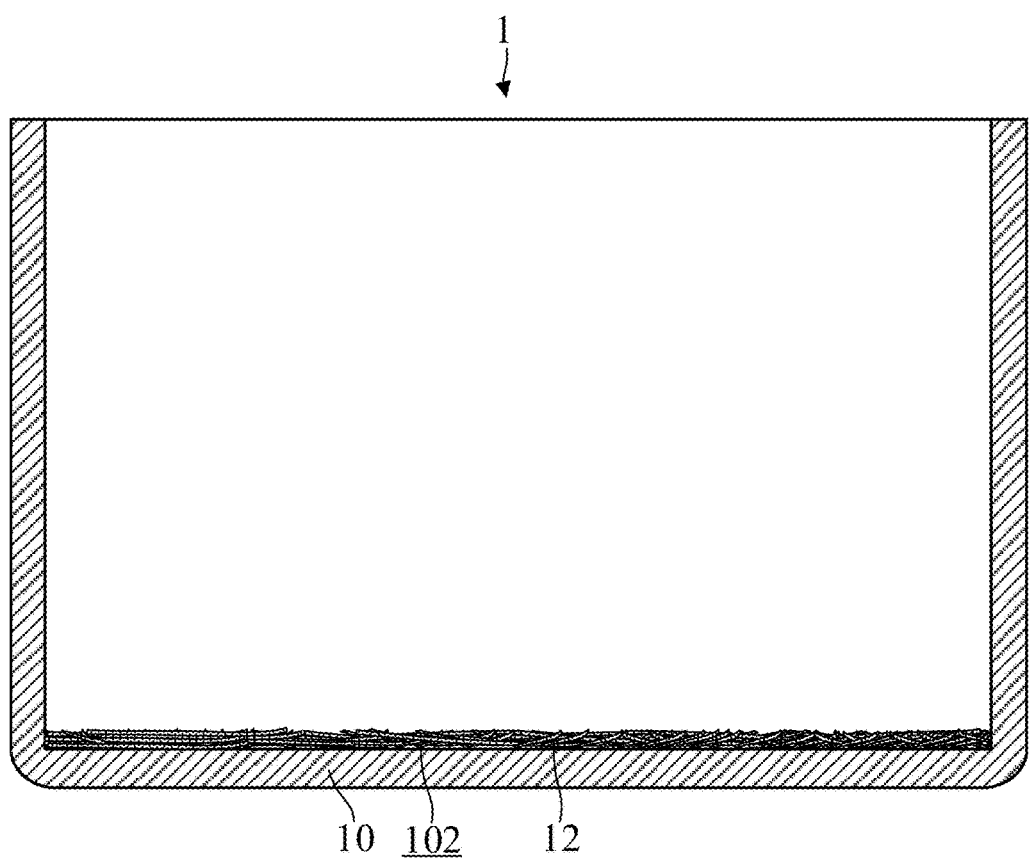
FIG. 1 is a sectional view of a crucible assembly according to a preferred embodiment of the invention.

Referring to FIG. 1, the drawing schematically shows a crucible assembly 1 according to the first preferred embodiment of the invention via a sectional view. The crucible assembly 1 of the invention is used for manufacture of a crystalline silicon ingot.

As shown in FIG. 1, the crucible assembly 1 of the invention includes a crucible body 10 and a first fiber textile article 12. The crucible body 10 has a bottom 102. In one embodiment, the crucible body 10 may be made of quartz, silicon oxide, aluminum oxide or graphite.

The first fiber textile article 12 is constituted by a plurality of first carbon fibers, and loaded on the bottom 102 of the crucible body 10. In particular, the first fiber textile article 12 has a plurality of intrinsic first pores randomly arranged, i.e., the first carbon fibers form the pores between the first carbon fibers. Thereby, the first fiber textile article 12 can resist Fe, Al and other impurities in the bottom 102 of the crucible body 10 in diffusing into the silicon melt or the crystalline silicon ingot. The first pores in the first fiber textile article 12 can promote small-sized silicon grains to nucleate from the silicon melt. The first fiber article 12 can also assist the crystalline silicon ingot in releasing therefrom.

Figure 2:
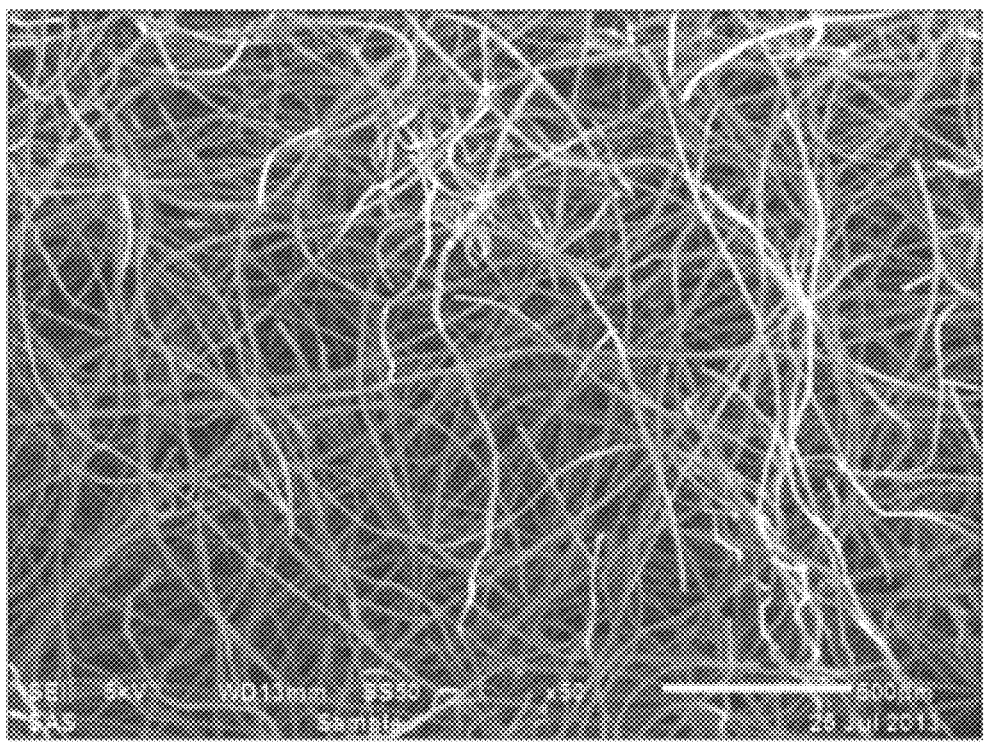
FIG. 2 is an optical micrograph of an example of the first fiber textile article used in the invention.
Figure 3:
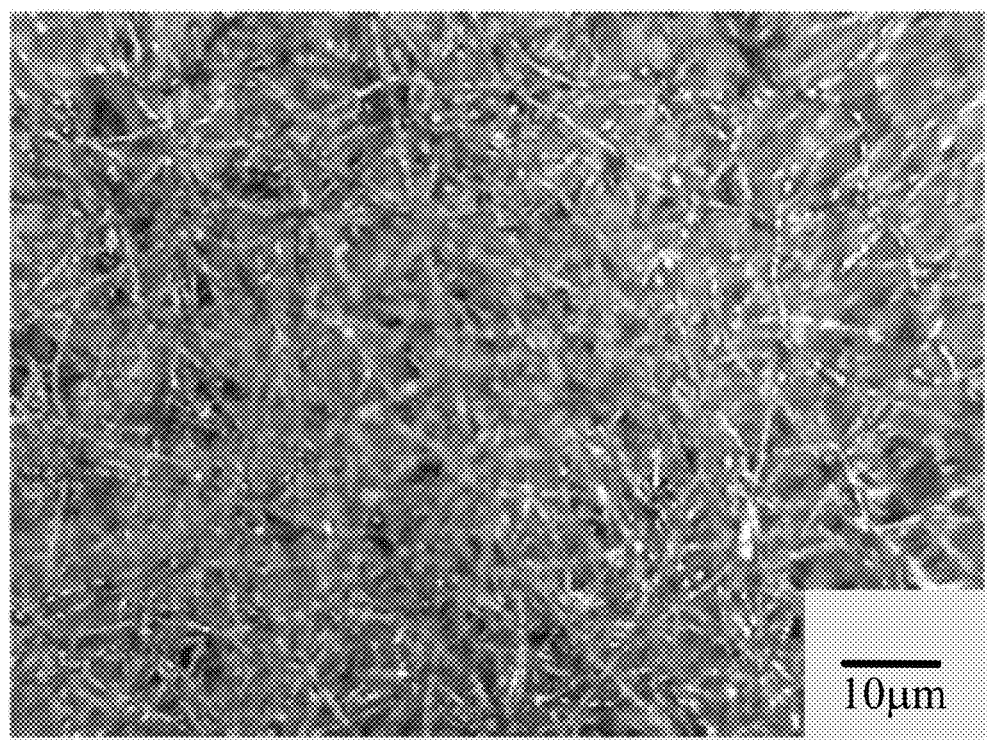
FIG. 3 is an optical micrograph of another example of the first fiber textile article used in the invention.

FIG. 2 is an optical micrograph of an example of the first fiber textile article 12 used in the invention. FIG. 3 is an optical micrograph of another example of the first fiber textile article 12 used in the invention.

In one embodiment, each intrinsic first pore has an aperture in a range of from 0.05 mm to 2 mm, where each first carbon fiber has a diameter in a range of from 1 μm to 500 μm. It is preferred that the average diameter of each first carbon fiber is 10 μm. The specific surface area of the first fiber textile article 12 of the invention is hundred times more than that of the plate with smooth surface or the layer of porous material with molded and regularly arranged pores by sintering. Thereby, the first fiber textile article 12 can provide silicon grains with more nucleation sites during manufacture of the crystalline silicon ingot.

The specific surface area (S) is generally measured in a gas adsorption way, and is calculate by the equation:

$$S = \frac{V_m \times N \times a}{m \times 22400}$$

where S is the specific surface area and expressed in m²/g, $V_m$ is the volume of mono-layer of gas adsorbed by the measured specimen and expressed in m³, N is Avogadro constant ($6.023 \times 10^{23}$ mol$^{-1}$), a is the effective cross-sectional area of one adsorbed molecule and in square meters, and m is the mass of measured specimen and expressed in g.

Figure 4:
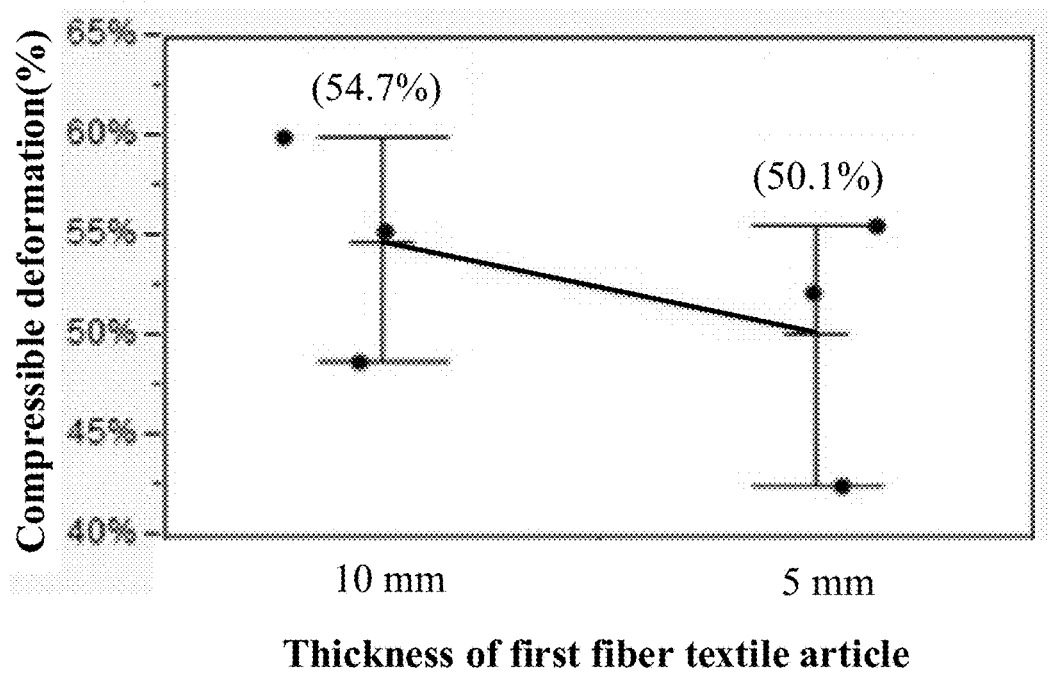
FIG. 4 is a diagram showing the measured compressible deformation of the first fiber textile article used in the invention.

Different from the layer of rigid and porous material disclosed in the prior art, the first fiber textile article 12 of the invention is a layer of compressible and porous material. In an example, the first fiber textile articles 12 are respectively 10 mm and 5 mm thick, and are performed by a compressible deformation test. The results of the compressible deformation are shown in FIG. 4.

In one embodiment, the first fiber textile article 12 has a compressible deformation in a range of from 20% to 80%, and preferredly from 40% to 60%. It is more preferred that the average compressible deformation of the first fiber textile article 12 is 50%.

Figure 5:
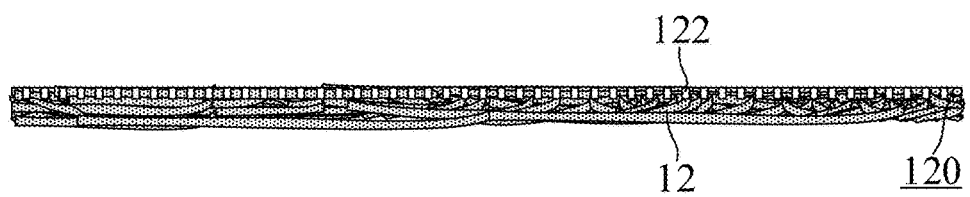
FIG. 5 is a sectional view of a modification of the first fiber textile article used in the invention.

Referring to FIG. 5, the drawing schematically shows a modification of the first fiber textile article 12 of the invention via a sectional view. As shown in FIG. 5, the first fiber textile article 12 also has a plurality of extrinsic pores 122 regularly arranged. The extrinsic pores 122 can be formed on the upper surface 120 of the first fiber textile article 12 by mechanical drilling, laser drilling, or other drilling way. Thereby, the extrinsic pores 122 of the first fiber textile article 12 can provide silicon grains with more effective nucleation sites during manufacture of the crystalline silicon ingot.

Figure 6:
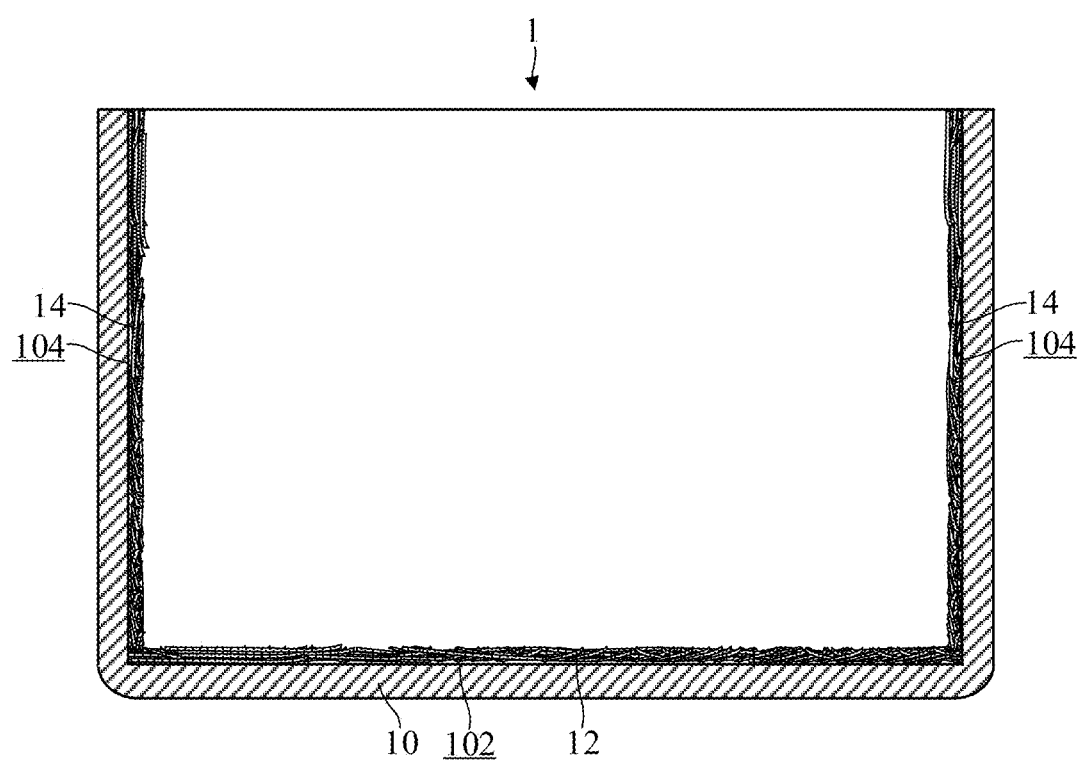
FIG. 6 is a sectional view of a modification of the crucible assembly of the invention.

Referring to FIG. 6, the drawing schematically shows a modification of the crucible assembly 1 of the invention via a sectional view. As shown in FIG. 6, the crucible body 10 also has an inner sidewall 104. The crucible assemble 1 of the invention further includes a second fiber textile article 14. The second fiber textile article 14 is made of a plurality of second carbon fibers, and loaded on the inner sidewall 104 of the crucible body 10. In particular, second fiber textile article 14 also has a plurality of intrinsic second pores randomly arranged. In general, the crucible body 10 has four inner sidewalls 104. Hence, in practice, four second fiber textile articles 14 are respectively on one of four inner sidewalls 104 of the crucible body 10.

Different from the crucible of the prior art with coating of a layer of silicon nitride on the inner wall thereof, the second fiber textile articles 14 can more effectively resist Fe, Al and other impurities in the inner sidewalls 104 of the crucible body 10 in diffusing into the silicon melt or the crystalline silicon ingot. The second fiber articles 14 can also assist the crystalline silicon ingot in releasing therefrom. The components and devices in FIG. 6 identical to those shown in FIG. 1 are given the same numerical notations, and will be not described in detail herein.

Referring to FIGS. 7 through 11, those drawings are sectional views schematically illustrating the procedures of a method of fabricating a crystalline silicon ingot according to a first preferred embodiment of the invention.

Figure 7:
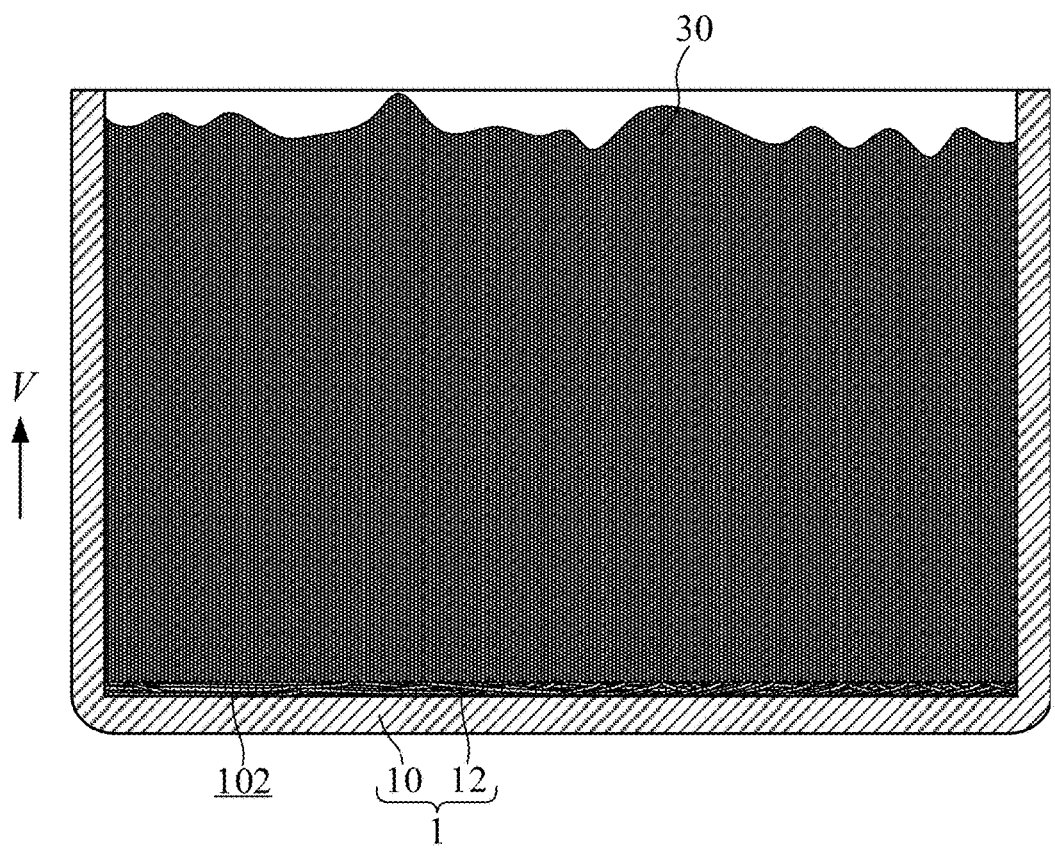
FIGS. 7 through 11 are sectional views schematically illustrating the procedures of a method of fabricating a crystalline silicon ingot according to a first preferred embodiment of the invention.

As shown in FIG. 7, the method of the invention is, firstly, to prepare the crucible assembly 1 of the invention, e.g., the crucible assembly 1 as shown in FIG. 1 or FIG. 6. In FIGS. 7 to 11, for explanation only, only the crucible assembly 1 as shown in FIG. 1 is illustrated. The crucible assembly 1 of the invention is suitable for melting and cooling the silicon feedstock based on a directional solidification process.

Also as shown in FIG. 7, next, the method of the invention is to load a silicon feedstock 30 on the first fiber textile article 12 in the crucible assembly 1.

Figure 8:
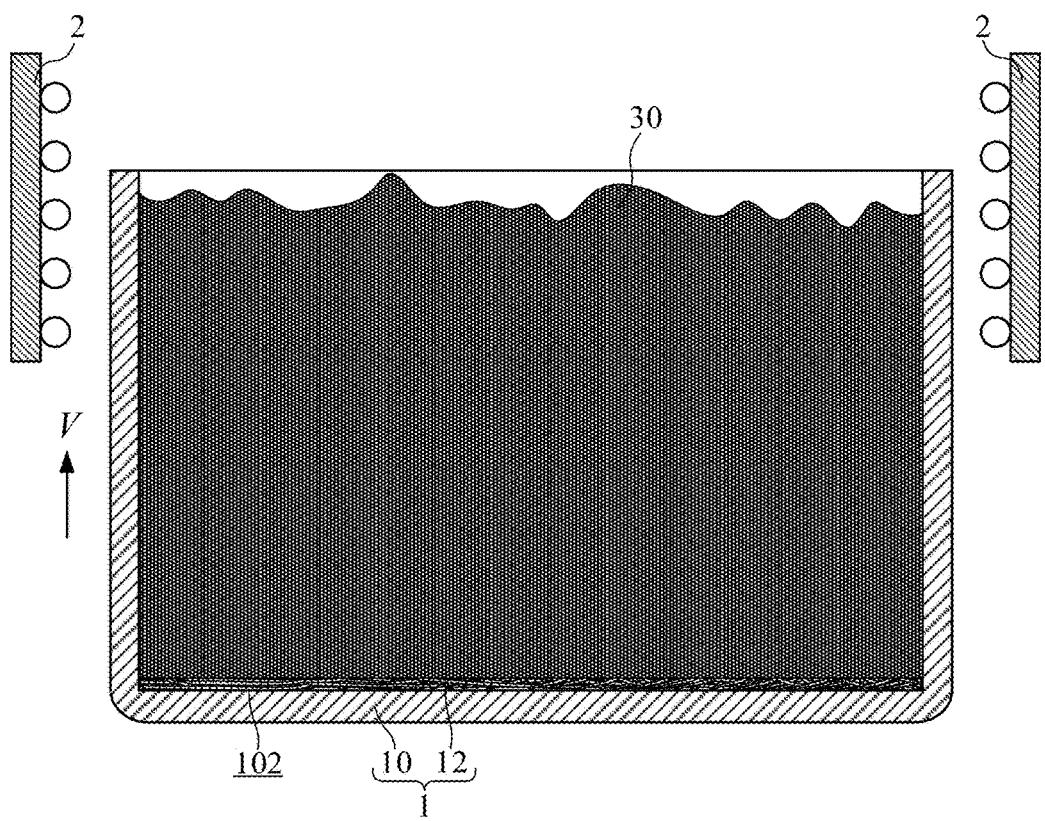

As shown in FIG. 8, then, the method of the invention is to place the crucible assembly 1 loaded with the silicon feedstock 30 in a direction solidification system furnace. For explanation only, only a heater 2 is illustrated in FIG. 8 to represent the direction solidification system furnace.

Figure 9:
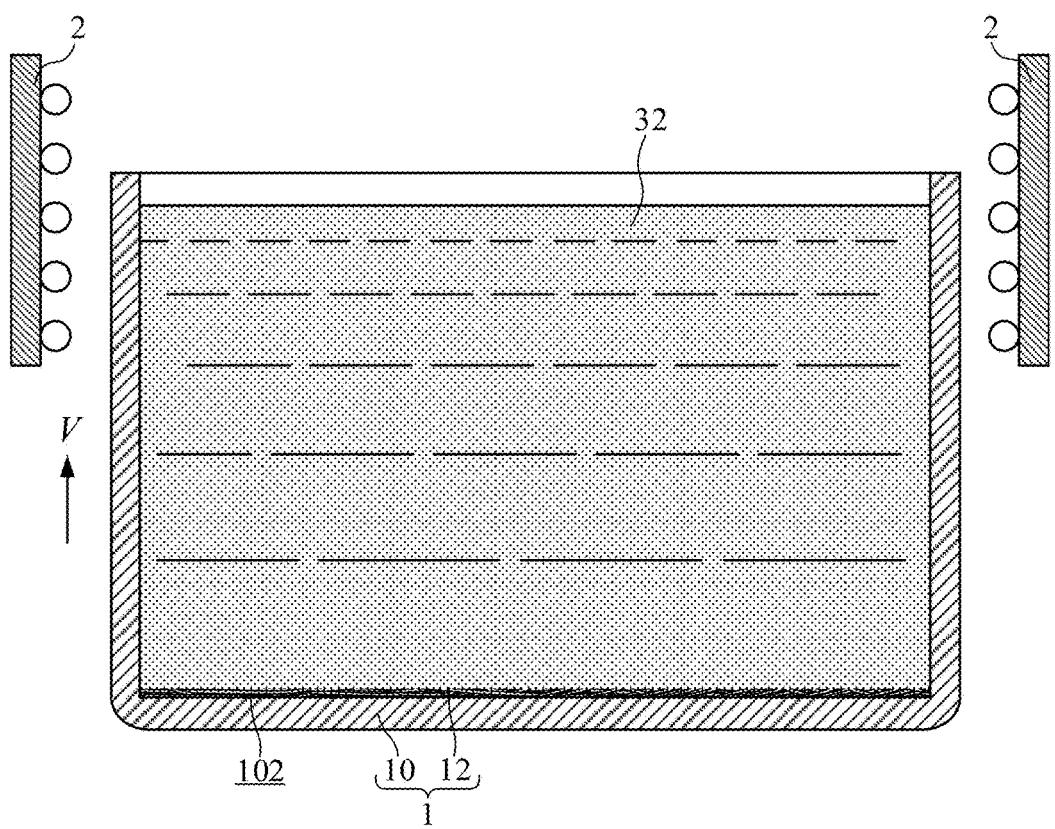

As shown in FIG. 9, then, the method of the invention is to heat the crucible assembly 1 of the invention until the silicon feedstock 30 is melted into a silicon melt 32 completely.

Figure 10:
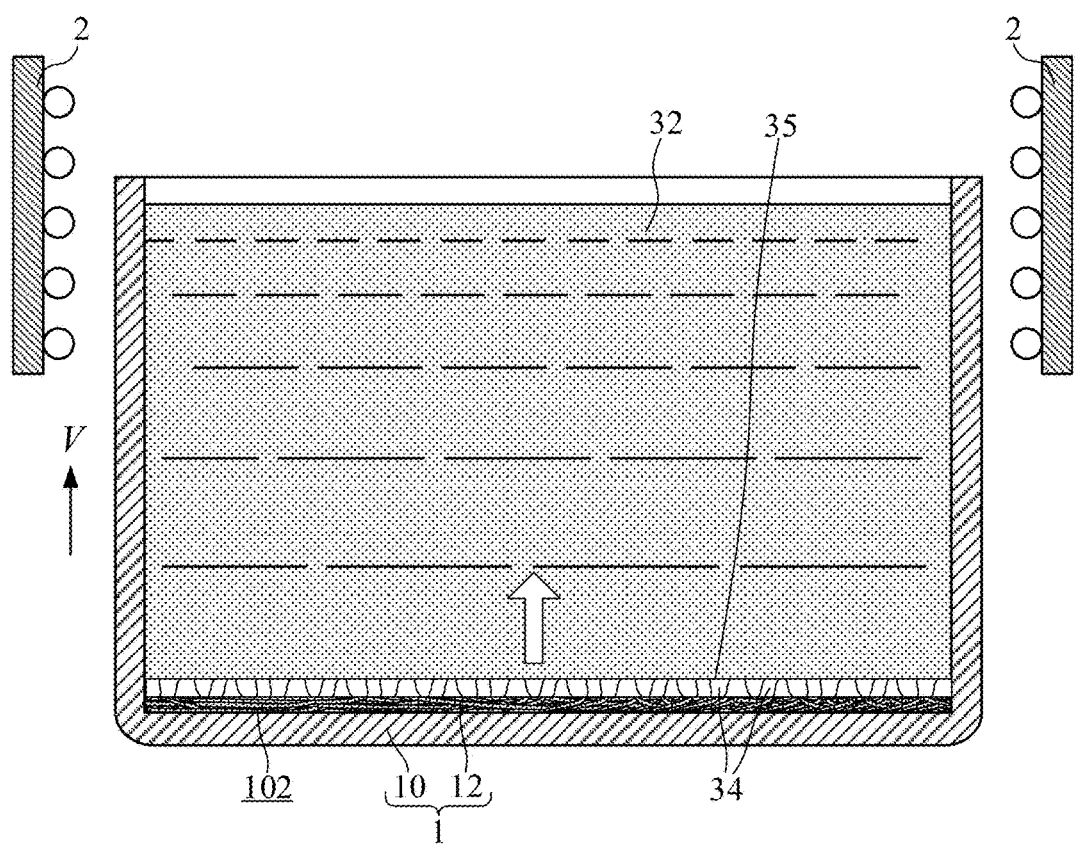

Afterward, as shown in FIG. 10, the method of the invention is, based on a directional solidification process, to cool the crucible assembly 1 such that a plurality of silicon grains 34 from the silicon melt 32 nucleate at the intrinsic first pores and grow in a vertical direction V of the crucible assembly 1. During the solidification of the silicon melt 32, as shown in FIG. 10, the solid/liquid phase interface between the silicon melt 32 and the front of the silicon grains 34 been solidified moves toward the opening of the crucible assembly 1.

Figure 11:
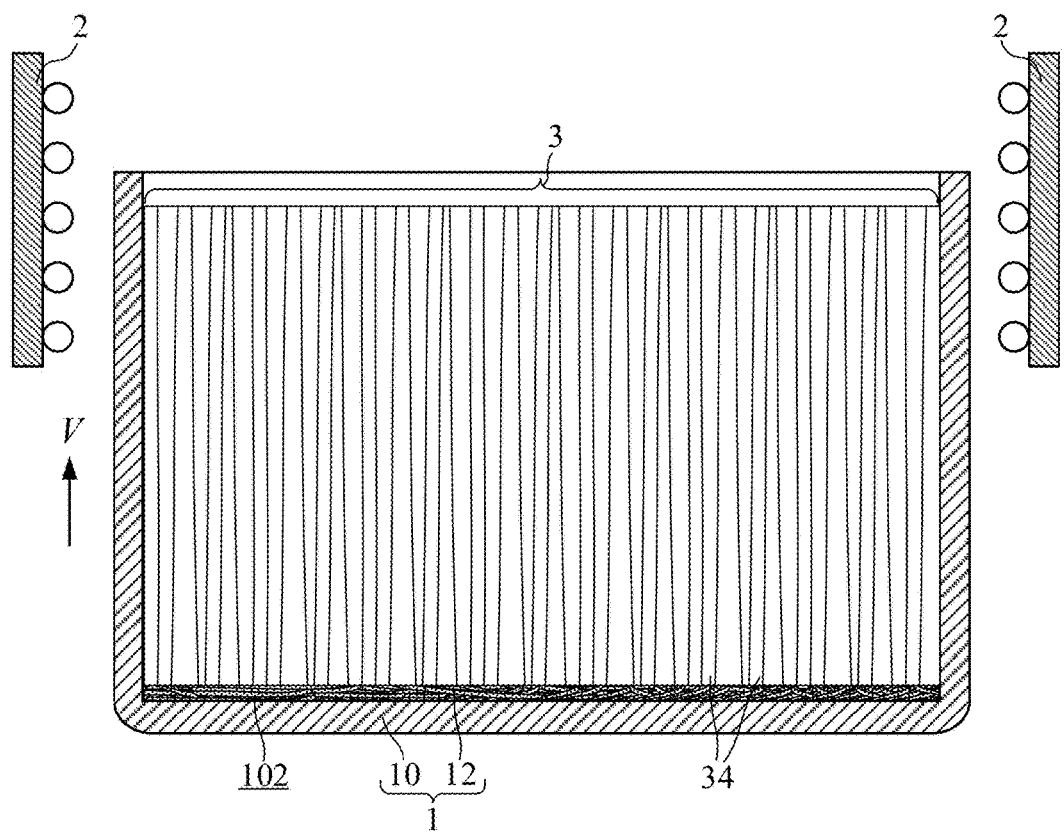

Finally, as shown in FIG. 11, the method of the invention is, based on the directional solidification process, to continuously cool the crucible assembly 1 until entirety of the silicon melt 32 is solidified to obtain the crystalline silicon ingot 3.

Compared to the crucible of the prior art with coating of a layer of silicon nitride on the inner wall thereof, during the manufacture of the crystalline ingot 3, the first fiber textile article 12 and the second fiber textile articles 14 can more effectively resist Fe, Al and other impurities in the bottom 102 and the inner sidewalls 104 of the crucible body 10 in diffusing into the silicon melt 32 or the silicon grains 34. The resultant crystalline silicon ingot 3 has lower whole defect density and reduced impurity-polluted zone. The first fiber textile article 12 can also inhibit the defect density of the silicon grains 34 in increasing during the growth of the silicon grains 34. The first fiber textile article 12 and the second fiber textile article 14 can also lower the oxygen content of the crystalline silicon ingot 3. The intrinsic first pores and the extrinsic pores 122 of the first fiber textile article 12 provide the silicon grains 34 with nucleation sites where the average grain size of the silicon grains 34 of the resultant crystalline silicon ingot 3 adjacent to the first fiber textile article 12 is less than about 10 mm. The first fiber textile article 12 and the second fiber textile article 14 can assist the crystalline silicon ingot 3 in releasing from the crucible assembly 1.

Referring to FIGS. 12 through 15, those drawings are sectional views schematically illustrating the procedures of a method of fabricating a crystalline silicon ingot according to a second preferred embodiment of the invention.

Figure 12:
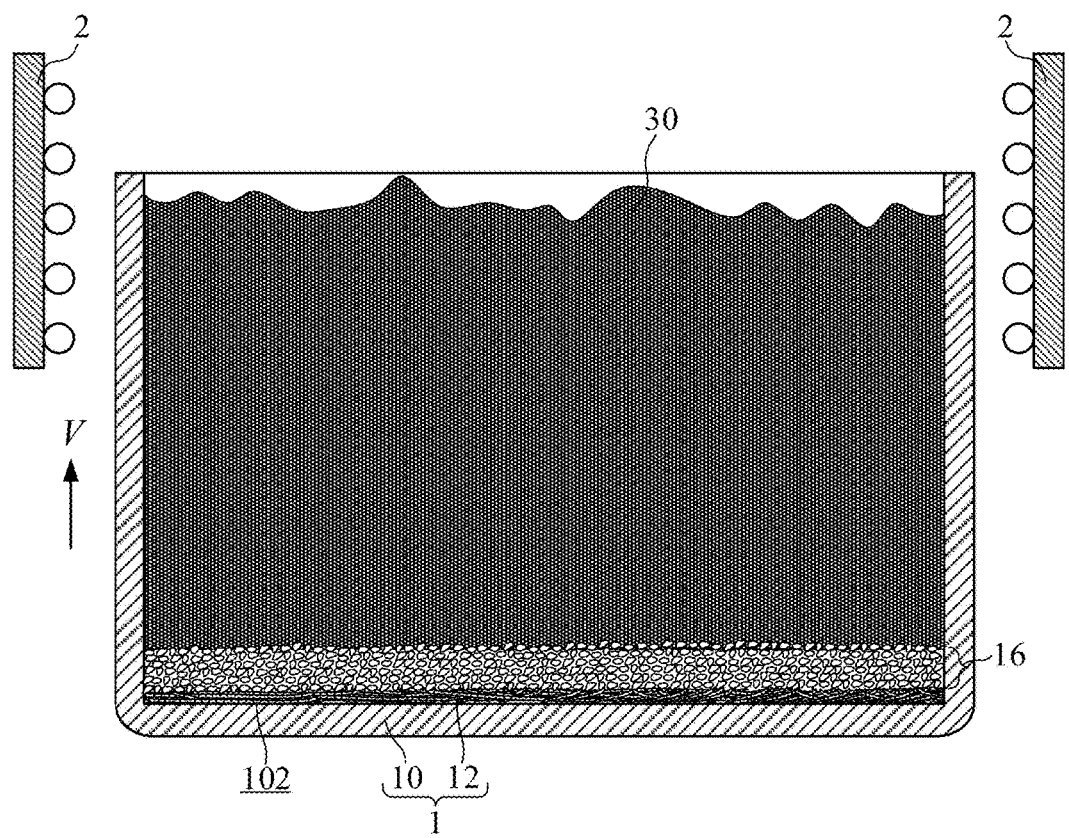
FIGS. 12 through 15 are sectional views schematically illustrating the procedures of a method of fabricating a crystalline silicon ingot according to a second preferred embodiment of the invention.

As shown in FIG. 12, the method of the invention is, firstly, to prepare the crucible assembly 1 of the invention, e.g., the crucible assembly 1 as shown in FIG. 1 or FIG. 6. In FIGS. 12 to 15, for explanation only, only the crucible assembly 1 as shown in FIG. 1 is illustrated. Next, the method of the invention is to load a plurality of crystalline particles 16 with irregular shape on the first fiber textile article 12 in the crucible assembly 1. In practical application, at least two layers of the crystalline particles 16 with irregular shape are loaded on the first fiber textile article 12.

In one embodiment, each crystalline particles 16 has a particle size of less than about 50 mm.

In one embodiment, the plurality of the crystalline particles 16 may be poly-Si particles, mono-Si particles, single crystal silicon carbide or other crystalline particles having a melting point higher than 1400□ and being capable of facilitating nucleation. In an example, the plurality of the crystalline particles 16 may be commercially available poly-S or mono-Si chips or chunks that cost much less significantly than the mono-Si seeds.

Then, the method of the invention is to load a silicon feedstock 30 on the plurality of crystalline particles 16 with irregular shape in the crucible assembly 1. Next, the method of the invention is to place the crucible assembly 1 loaded with the silicon feedstock 30 and the crystalline particles 16 in a direction solidification system furnace. For explanation only, only a heater 2 is illustrated in FIG. 12 to represent the direction solidification system furnace.

Figure 13:
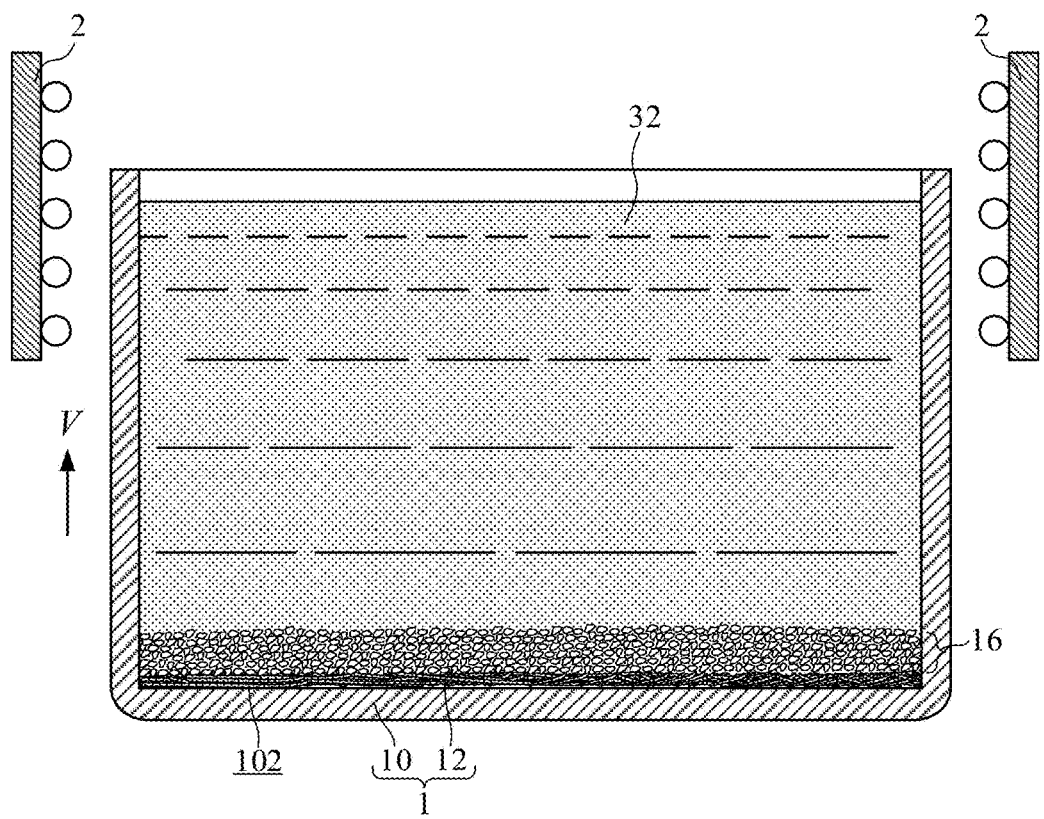

Afterward, as shown in FIG. 13, the method of the invention is to heat the crucible assembly 1 until the silicon feedstock 30 is melted into a silicon melt 32 completely where the crystalline particles 16 with irregular shape are melt partly.

Figure 14:
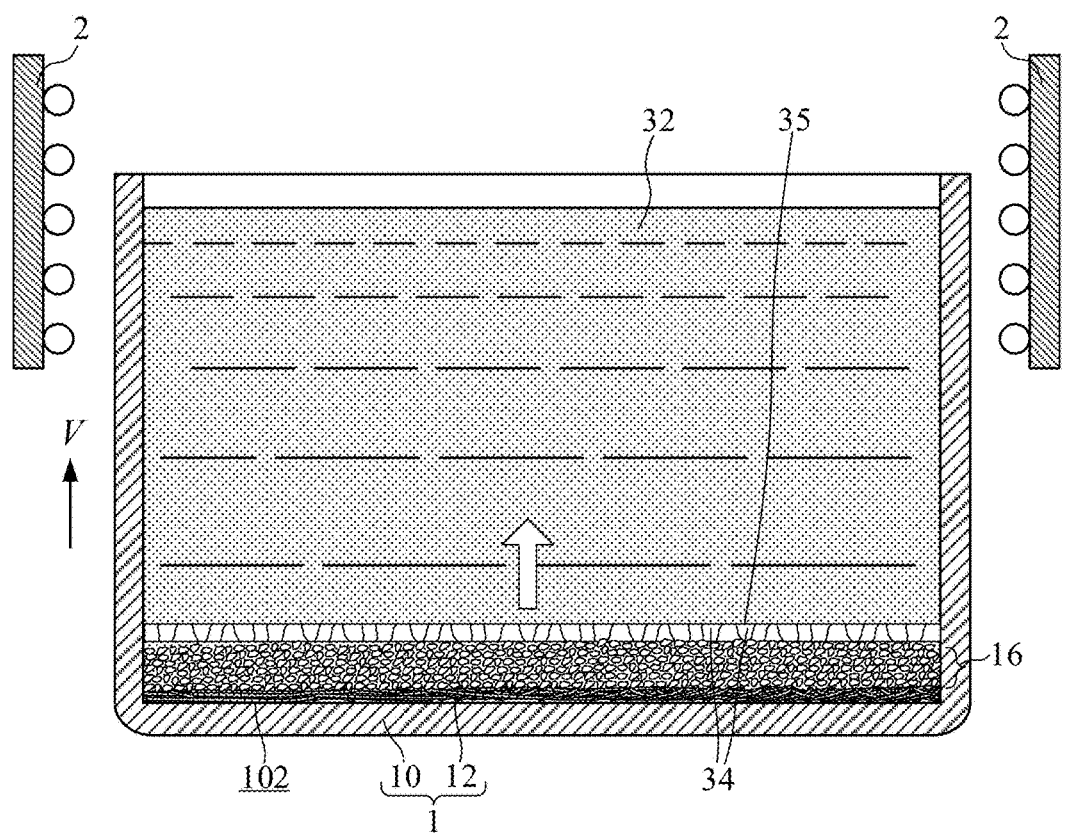

Then, as shown in FIG. 14, the method of the invention is, based on a directional solidification process, to cool the crucible assembly 1 such that a plurality of silicon grains 34 from the silicon melt 32 nucleate at the crystalline particles 16 with irregular shape and grow in a vertical direction V of the crucible assembly 1. During the solidification of the silicon melt 32, as shown in FIG. 13, the solid/liquid phase interface between the silicon melt 32 and the front of the silicon grains 34 been solidified moves toward the opening of the crucible assembly 1.

Figure 15:
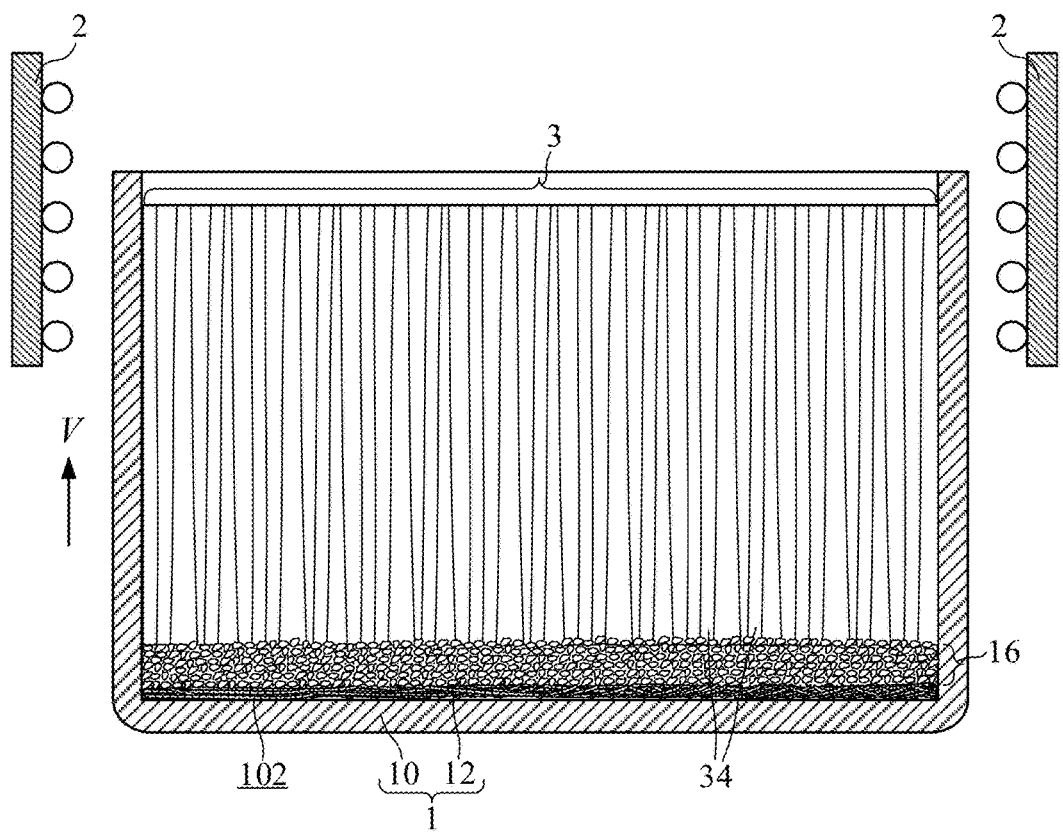

Finally, as shown in FIG. 15, the method of the invention is, based on the directional solidification process, to continuously cool the crucible assembly 1 until entirety of the silicon melt 32 is solidified to obtain the crystalline silicon ingot 3.

Similarly, during manufacture of the crystalline silicon ingot 3 by the method according the second preferred embodiment of the invention, the crystalline particles 16 can inhibit the defect density of the silicon grains 34 in increasing during the growth of the silicon grains 34. The first fiber textile article 12 and the second fiber textile article 14 can also lower the oxygen content of the crystalline silicon ingot 3. The crystalline particles 16 provide the silicon grains 34 with nucleation sites where the average grain size of the silicon grains 34 of the resultant crystalline silicon ingot 3 adjacent to the crystalline particles 16 is less than about 10 mm. The first fiber textile article 12 and the second fiber textile article 14 can assist the crystalline silicon ingot 3 in releasing from the crucible assembly 1.

Hereinafter, the measurements regarding a crystalline silicon ingot A (referred to as 'ingot A'), a crystalline silicon ingot B (referred to as 'ingot B'), a crystalline silicon ingot C (referred to as 'ingot C'), and a crystalline silicon ingot D (referred to as 'ingot D') are described. The ingot A is fabricated according to the method of the first preferred embodiment of the invention and using the crucible body 10 with the first fiber textile article 12 at the bottom 102 thereof. As a comparison, the ingot B is fabricated according to the method similar to that of the crystalline silicon ingot A but using the crucible body 10 without the first fiber textile article 12 where the undercooling at the bottom of the crucible body 10 is controlled to benefit in nucleation of the silicon grains. The ingot C is fabricated according to the method of the second preferred embodiment of the invention and using the crucible body 10 with the first fiber textile article 12 at the bottom 102 thereof and four second fiber textile articles 14 at the inner sidewalls 104 thereof. As a comparison, the ingot D is fabricated according to the method similar to that of the crystalline silicon ingot B but using the crucible body 10 without the first fiber textile article 12 and the second fiber textile articles 14.

Figure 16:
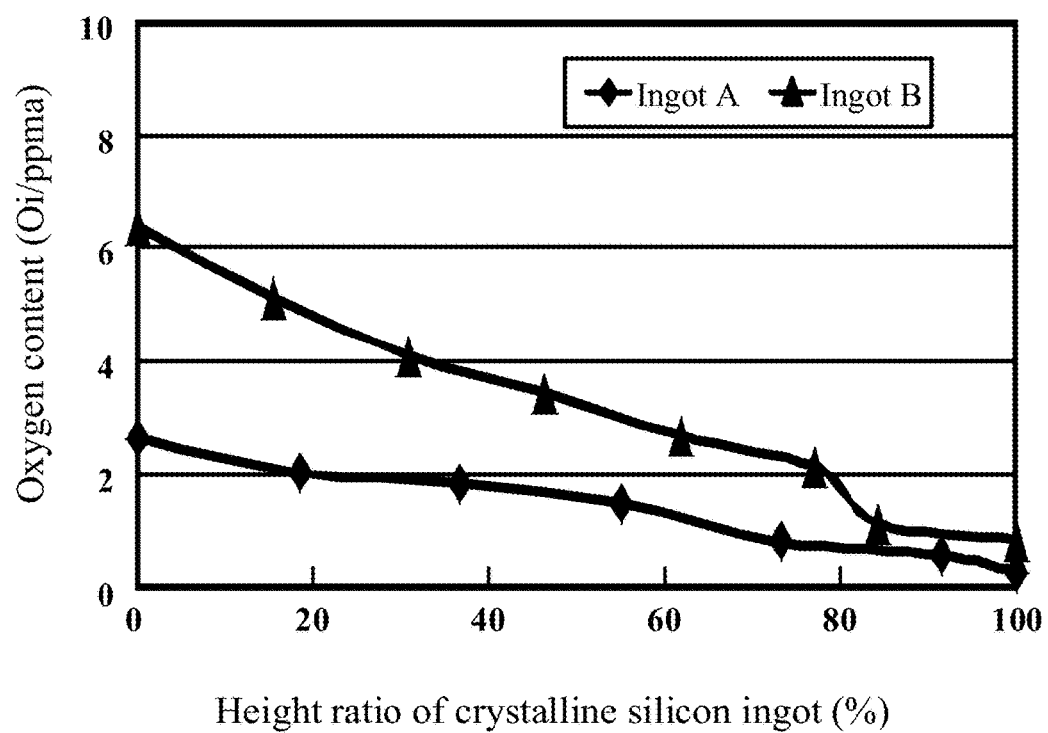
FIG. 16 is a diagram showing the oxygen content in the ingot A (manufactured according to the first preferred embodiment of the invention) and the ingot B (manufactured according to a conventional method) for comparison.

Referring to FIG. 16, the change of the oxygen content in the ingot A versus the height ratio of the ingot A is shown. It is noted that the oxygen content in silicon ingot affects interstitial defects. As a comparison, the change of the oxygen content in the ingot B versus the height ratio of the ingot B is also shown in FIG. 16. The results shown in FIG. 16 prove that sampling at the same height ratio, the defect density of the ingot A is lower that of the ingot B. The prior arts all do not disclose solution for lowering the oxygen content in the crystalline silicon ingot. However, many researches prove that the oxygen content in the crystalline silicon ingot will affect the optical decay and the photoelectric conversion efficiency of the photovoltaic cell made therefrom.

Referring to table 1, the average photoelectric conversion efficiency of the photovoltaic cell made from the bottom, middle, and top of the central region of the ingot A is listed. As a comparison, the average photoelectric conversion efficiency of the photovoltaic cell made from the bottom, middle, and top of the central region of the ingot B is also listed in table 1. Data in table 1 prove that the average photoelectric conversion efficiency of the photovoltaic cell made from different regions of the ingot A is 17.40%, and is higher than that made from different regions of the ingot B (17.30%). It is evident that the quality of the ingot A (manufactured according to the first preferred embodiment of the invention) is better than that of ingot B (manufactured according to a conventional method).

TABLE 1

|  | Ingot A | Ingot B |
| --- | --- | --- |
| Optical conversion effectivity (%) | 17.40 | 17.30 |

Figure 17:
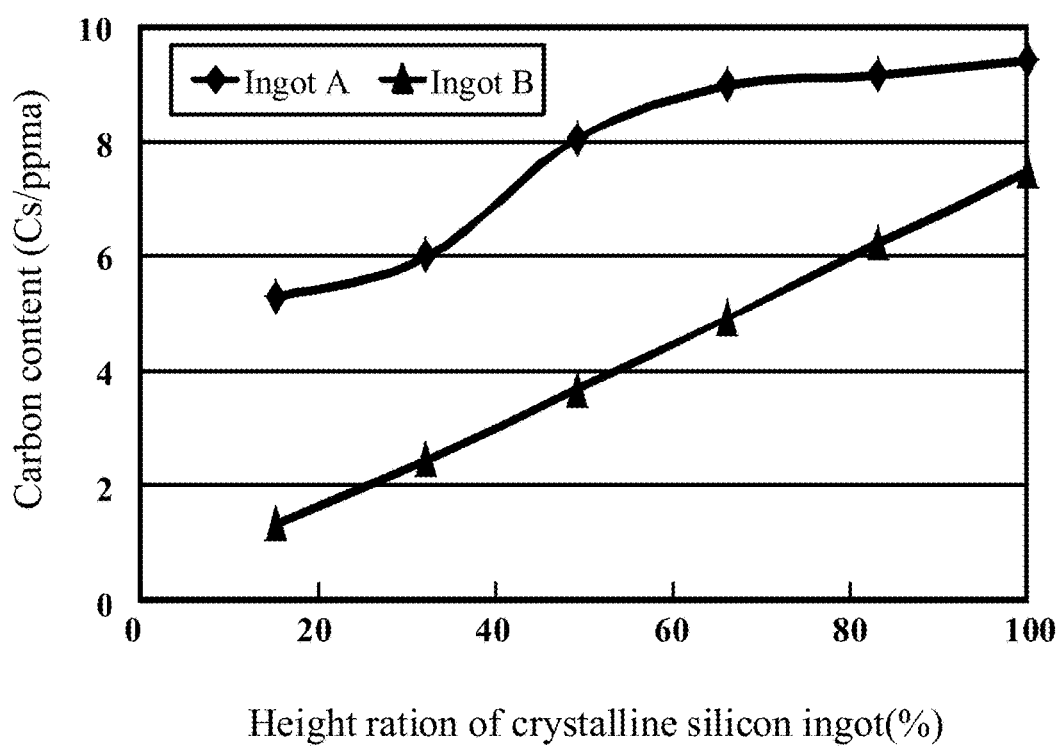
FIG. 17 is a diagram showing the carbon content in the ingot A (manufactured according to the first preferred embodiment of the invention) and the ingot B (manufactured according to a conventional method) for comparison.

Referring to FIG. 17, the change of the carbon content in the ingot A versus the height ratio of the ingot A is shown. As a comparison, the change of the carbon content in the ingot B versus the height ratio of the ingot B is also shown in FIG. 17. The results shown in FIG. 17 prove that sampling at the same height ratio, the carbon content of the ingot A is lower that of the ingot B. The first fiber textile article 12 is constituted by a plurality of first carbon fibers. Little of carbon could diffuse into the silicon melt as the silicon melt contacts the first fiber textile article 12. Therefore, the carbon content of the ingot A is higher than that of a crystalline silicon ingot manufactured according to a general method, but still meets industrial specification.

The prior arts all do not disclose solution for lowering the oxygen content in the crystalline silicon ingot. However, many researches prove that the oxygen content in the crystalline silicon ingot will affect the optical decay and the photoelectric conversion efficiency of the photovoltaic cell made therefrom. Because the average photoelectric conversion efficiency of the photovoltaic cell made from different regions of the ingot A is higher than that made from different regions of the ingot B, the higher carbon content of the ingot A does not lower the quality of the ingot A.

Referring to table 2, the ratio of measured red zones (zones in ingot not meeting requirement) of the ingot A and ingot B are listed. Data in table 2 prove that the available zone of the ingot A is more than 14% of that of ingot B. This also proves that the first fiber textile article 12 used in the invention can effectively resist Fe, Al and other impurities in the crucible body in diffusing into the silicon melt or the silicon grains. It is evident that the ingot A has more commercial value than the ingot B.

TABLE 2

|  | Ingot A | Ingot B |
| --- | --- | --- |
| Red zone ratio (%) | 21 | 35 |

Figure 18:
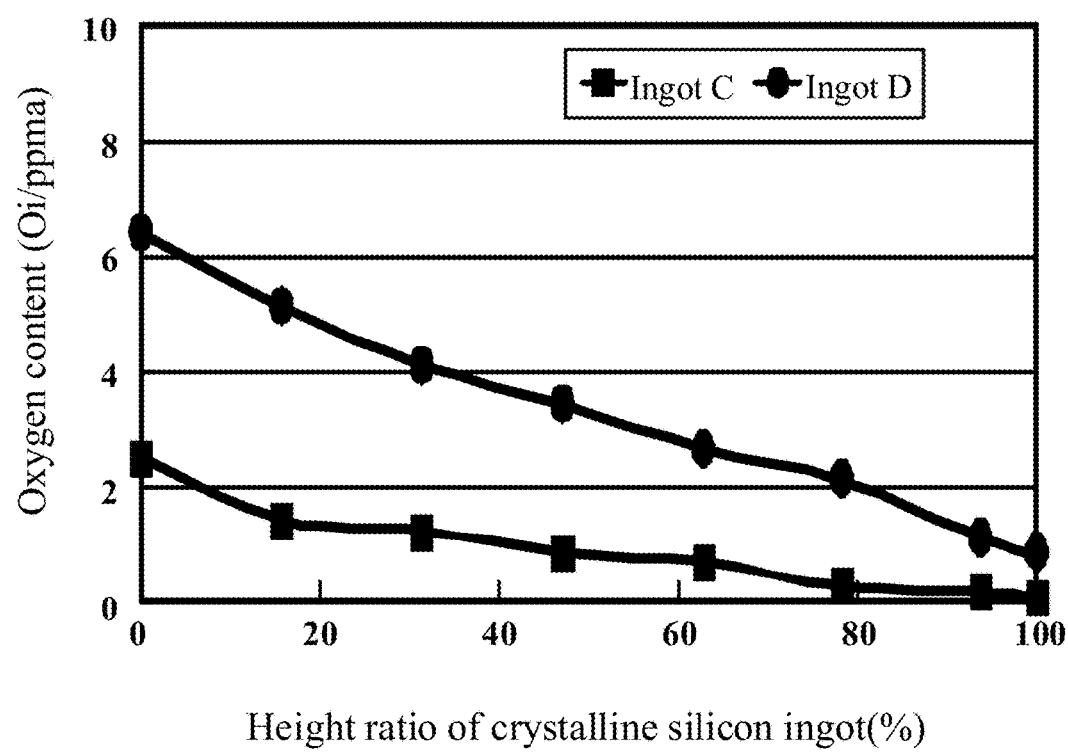
FIG. 18 is a diagram showing the oxygen content in the ingot C (manufactured according to the second preferred embodiment of the invention) and the ingot D (manufactured according to a conventional method) for comparison.

Referring to FIG. 18, the change of the oxygen content in the ingot C versus the height ratio of the ingot C is shown. It is noted that the oxygen content in silicon ingot affects interstitial defects. As a comparison, the change of the oxygen content in the ingot D versus the height ratio of the ingot D is also shown in FIG. 18. The results shown in FIG. 18 prove that sampling at the same height ratio, the defect density of the ingot C is lower that of the ingot D.

Referring to table 3, the average photoelectric conversion efficiency of the photovoltaic cell made from the bottom, middle, and top of the central region of the ingot C is listed. As a comparison, the average photoelectric conversion efficiency of the photovoltaic cell made from the bottom, middle, and top of the central region of the ingot D is also listed in table 3. Data in table 3 prove that the average photoelectric conversion efficiency of the photovoltaic cell made from different regions of the ingot C is 17.79%, and is higher than that made from different regions of the ingot D (17.60%). It is evident that the quality of the ingot C (manufactured according to the second preferred embodiment of the invention) is better than that of ingot D (manufactured according to a conventional method).

TABLE 3

|  | Ingot C | Ingot D |
| --- | --- | --- |
| Optical conversion effectivity (%) | 17.79 | 17.60 |

Figure 19:
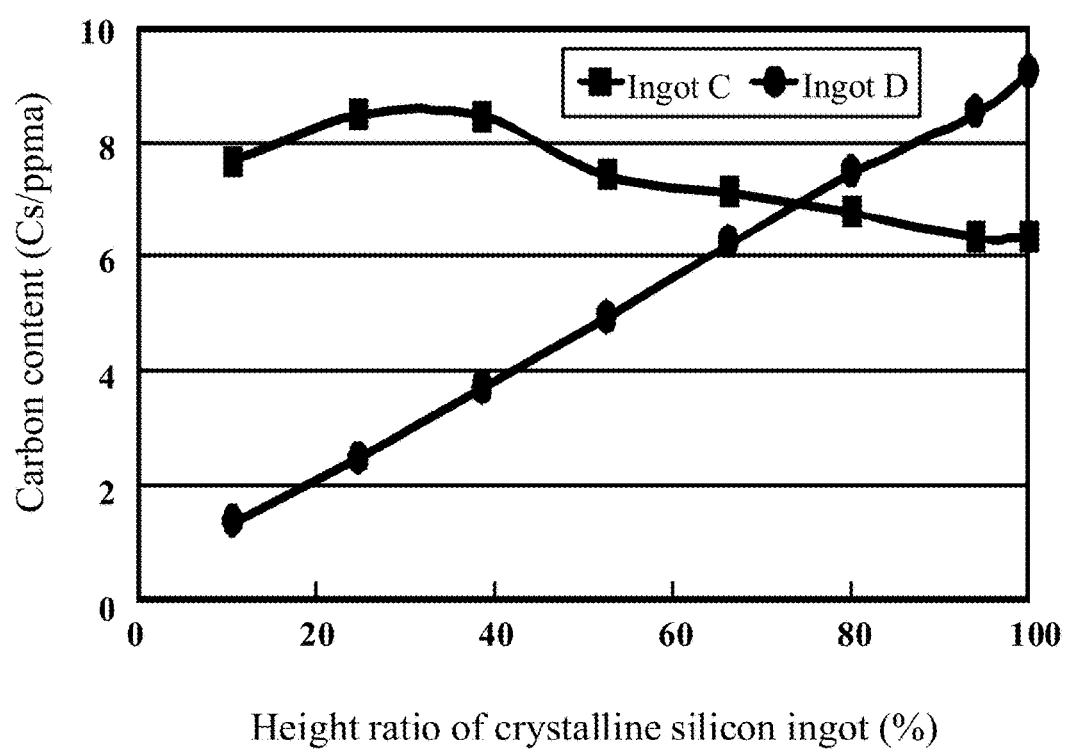
FIG. 19 is a diagram showing the carbon content in the ingot C (manufactured according to the second preferred embodiment of the invention) and the ingot D (manufactured according to a conventional method) for comparison.

Referring to FIG. 19, the change of the carbon content in the ingot C versus the height ratio of the ingot C is shown. As a comparison, the change of the carbon content in the ingot D versus the height ratio of the ingot D is also shown in FIG. 19. The results shown in FIG. 19 prove that sampling at the same height ratio, the carbon content of the ingot C is lower that of the ingot D, other than sampling at the top region. The first fiber textile article 12 is constituted by a plurality of first carbon fibers, and the second fiber textile article 14 is constituted by a plurality of second carbon fibers. Little of carbon could diffuse into the silicon melt as the silicon melt contacts the first fiber textile article 12 and the second fiber textile article 14. Therefore, the carbon content of the ingot C is higher than that of a crystalline silicon ingot manufactured according to a general method, but still meets industrial specification. Because the average photoelectric conversion efficiency of the photovoltaic cell made from different regions of the ingot C is higher than that made from different regions of the ingot D, the higher carbon content of the ingot C does not lower the quality of the ingot C.

Referring to table 4, the ratio of measured red zones (zones in ingot not meeting requirement) of the ingot C and ingot D are listed. Data in table 4 prove that the available zone of the ingot C is more than 25% of that of ingot D. This also proves that the first fiber textile article 12 and the second fiber textile article 14 used in the invention can effectively resist Fe, Al and other impurities in the crucible body in diffusing into the silicon melt or the silicon grains. It is evident that the ingot C has more commercial value than the ingot D.

TABLE 4

|  | Ingot C | Ingot D |
| --- | --- | --- |
| Red zone ratio (%) | 30 | 55 |

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A crucible assembly, comprising:
   a crucible body having a bottom; and
   a first fiber textile article being made of a plurality of first carbon fibers, being loaded on the bottom of the crucible body, and having a plurality of intrinsic first pores randomly arranged, wherein the first fiber textile article has a compressible deformation in a range of from 20% to 80%, and each first carbon fiber has a diameter in a range of from 1 μm to 500 μm.

2. The crucible assembly of claim 1, wherein each intrinsic first pore has an aperture in a range of from 0.05 mm to 2 mm.

3. The crucible assembly of claim 1, wherein the crucible body also has an inner sidewall, the crucible assemble further comprises a second fiber textile article which is made of a plurality of second carbon fibers, is loaded on the inner sidewall of the crucible body, and has a plurality of intrinsic second pores randomly arranged.

4. A method of manufacturing a crystalline silicon ingot, comprising the steps of:
   preparing the crucible assembly as claimed in claim 1;
   loading a silicon feedstock on the first fiber textile article in the crucible assembly;
   heating the crucible assembly until the silicon feedstock is melted into a silicon melt completely;
   based on a directional solidification process, cooling the crucible assembly such that a plurality of silicon grains from the silicon melt nucleate at the intrinsic first pores and grow in a vertical direction of the crucible assembly; and
   based on the directional solidification process, continuously cooling the crucible assembly until entirety of the silicon melt is solidified to obtain the crystalline silicon ingot.

5. The method of claim 4, wherein the crystalline silicon ingot has an oxygen content in a range of from 0.1 ppma to 4 ppma.

6. The method of claim 4, wherein the crystalline silicon ingot has a carbon content in a range of from 6 ppma to 10 ppma.

7. A method of manufacturing a crystalline silicon ingot, comprising the steps of:
   preparing the crucible assembly as claimed in claim 1;
   loading a plurality of crystalline particles with irregular shape on the first fiber textile article in the crucible assembly;
   loading a silicon feedstock on the plurality of crystalline particles with irregular shape in the crucible assembly;
   heating the crucible assembly until the silicon feedstock is melted into a silicon melt completely, wherein the crystalline particles with irregular shape are melt partly;
   based on a directional solidification process, cooling the crucible assembly such that a plurality of silicon grains from the silicon melt nucleate at the crystalline particles with irregular shape and grow in a vertical direction of the crucible assembly; and
   based on the directional solidification process, continuously cooling the crucible assembly until entirety of the silicon melt is solidified to obtain the crystalline silicon ingot, wherein the first fiber textile article assist the crystalline silicon ingot in releasing from the crucible body.

8. The method of claim 7, wherein each crystalline particle with irregular shape has a grain size of less than about 50 mm.

9. The method of claim 7, wherein the plurality of the crystalline particles with irregular shape comprise one selected from the group consisting of a poly-Si particle, a mono-Si particle, and a single crystal SiC particle.

10. The method of claim 7, wherein the crystalline silicon ingot has an oxygen content in a range of from 0.1 ppma to 4 ppma.

11. The method of claim 7, wherein the crystalline silicon ingot has a carbon content in a range of from 6 ppma to 10 ppma.

* * * * *